US008692346B2

(12) United States Patent
Park

(10) Patent No.: US 8,692,346 B2
(45) Date of Patent: Apr. 8, 2014

(54) METAL ENCAPSULATING SHEET AND ORGANIC LIGHT-EMITTING DISPLAY APPARATUS INCLUDING THE SAME

(75) Inventor: Seung-Kyu Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 79 days.

(21) Appl. No.: 13/300,476

(22) Filed: Nov. 18, 2011

(65) Prior Publication Data

US 2012/0248466 A1 Oct. 4, 2012

(30) Foreign Application Priority Data

Mar. 28, 2011 (KR) ........................ 10-2011-0027561

(51) Int. Cl.
*H01L 31/0203* (2006.01)

(52) U.S. Cl.
USPC ............... 257/433; 257/100; 257/59; 257/72; 257/40; 257/88

(58) Field of Classification Search
USPC .......................... 257/59, 72, 40, 88, 433, 100
See application file for complete search history.

(56) References Cited

U.S. PATENT DOCUMENTS

2008/0062373 A1* 3/2008 Kim et al. ..................... 349/151
2009/0189511 A1* 7/2009 Yamazaki et al. ............ 313/498

FOREIGN PATENT DOCUMENTS

JP 11-202357 7/1999
KR 10-0754145 8/2007

* cited by examiner

*Primary Examiner* — Tan N Tran
(74) *Attorney, Agent, or Firm* — Christie, Parker & Hale, LLP

(57) ABSTRACT

A metal encapsulating sheet is configured to cover a display unit on a substrate and includes an insulating base film, and metal wirings on the base film for forming a current path between the display unit and a power supply, wherein connecting units of the metal wirings coupled to the power supply are outside a light-emitting region corresponding to the display unit.

20 Claims, 6 Drawing Sheets

METAL ENCAPSULATING SHEET AND ORGANIC LIGHT-EMITTING DISPLAY APPARATUS INCLUDING THE SAME

CROSS-REFERENCE TO RELATED PATENT APPLICATION

This application claims priority to and the benefit of Korean Patent Application No. 10-2011-0027561, filed on Mar. 28, 2011, in the Korean Intellectual Property Office, the disclosure of which is incorporated herein in its entirety by reference.

BACKGROUND

1. Field

The present invention relates to an organic light-emitting display apparatus.

2. Description of Related Art

Generally, an organic light-emitting display apparatus includes a display unit having a thin-film transistor (TFT) and an organic light-emitting device, and a desired image is produced when the organic light-emitting device receives a suitable driving signal from the TFT and emits light.

Here, the TFT has a structure in which a gate electrode, an active layer, and source/drain electrodes are stacked on a substrate. Therefore, when a current is applied to the gate electrode via a circuit integrated in the substrate, the current flows to the source/drain electrodes via the active layer, and at the same time, the current flows to a pixel electrode of the organic light-emitting device coupled to the source/drain electrodes.

Furthermore, the organic light-emitting device includes the pixel electrode, a counter electrode facing the pixel electrode, and a light emitting layer interposed therebetween. When a current flows to the pixel electrode via the TFT as described above, a suitable voltage is formed between the counter electrode and the pixel electrode, and thus, light is emitted by the light emitting layer. As a result, an image is produced.

Therefore, an organic light-emitting display apparatus includes so-called Vdd wiring and Vss wiring as electric wirings for respectively applying voltages to the pixel electrode and the counter electrode. An organic light-emitting display apparatus further includes various wirings, such as a gate wiring for a scan signal, a data signal wiring, a control signal wiring for controlling a control timing for applying a current to the gate electrode, etc.

However, since currents flow in all such wirings, if such wirings closely overlap each other, partial capacitance loads may be formed, and thus, signals might not be accurately transmitted. For example, a capacitance may be formed between overlapped wirings to thereby delay transmission of a control signal, and thus, control timing may become inaccurate.

Since such wirings are all arranged in a TFT substrate that includes the TFT, gaps between the wirings are as narrow as several μm, and thus, delayed transmission of control signals due to capacitance loads may become serious if the wirings overlap each other.

SUMMARY

To reduce the problem of delayed transmission of control signals due to capacitance loads, there are demands for a method of forming a part of wirings for supplying power to a display unit not in a TFT substrate, but instead in an encapsulating member, such as an encapsulating layer that covers the display unit on the TFT substrate to protect the display unit from permeation of moisture and impurities.

Embodiments of the present invention provide a metal encapsulating sheet, which is an encapsulating member and has wirings efficiently arranged therein for supplying power to a display unit, and an organic light-emitting display apparatus including the same.

According to an embodiment of the present invention, there is provided a metal encapsulating sheet configured to cover a display unit on a substrate, the metal encapsulating sheet including an insulating base film, and metal wirings on the base film for forming a current path between the display unit and a power supply, wherein connecting units of the metal wirings coupled to the power supply are outside a light-emitting region corresponding to the display unit.

The metal wirings may include a first wiring coupled to a first electrode of the display unit, and a second wiring coupled to a second electrode of the display unit and electrically separated from the first wiring by the insulating base film.

A first connecting unit of the connecting units may correspond to the first wiring and a second connecting unit of the connecting units may correspond to the second wiring are at a same side of a same surface of the base film.

The connecting units may protrude out of the light-emitting region.

A circuit board may be directly coupled to the connecting units for coupling the connecting units and the power supply.

One or more of the connecting units may include terminal patterns.

One or more of the connecting units may include auxiliary metal films for strengthening solder attachment.

The metal encapsulating sheet may further include a dummy unit outside an area corresponding to the connecting units for increasing the size of the metal encapsulating sheet.

The connecting units may be outside an area of the metal encapsulating sheet across from the substrate on which the display unit is formed.

The light-emitting region may include the display unit and a sealing layer surrounding the display unit.

According to another embodiment of the present invention, there is provided an organic light-emitting display apparatus including a substrate, a display unit on the substrate, and an encapsulating member covering the display unit and including an insulating base film, and metal wirings on the base film for forming a current path between the display unit and a power supply, and connecting units coupled to the power supply and located outside a light-emitting region corresponding to the display unit.

The metal wirings may include a first wiring coupled to a first electrode of the display unit, and a second wiring coupled to a second electrode of the display unit and electrically separated from the first wiring by the insulating base film.

A first connecting unit of the connecting units may correspond to the first wiring and a second connecting unit of the connecting units may correspond to the second wiring are at a same side of a same surface of the base film.

The connecting units may protrude out of the light-emitting region.

A circuit board may be directly coupled to the connecting units for coupling the connecting units and the power supply.

The connecting units may include terminal patterns.

The connecting units may include auxiliary metal films for strengthening solder attachment.

The organic light-emitting display apparatus may further include a dummy unit outside an area corresponding to the connecting units for increasing the size of the metal encapsulating sheet.

The connecting units may be outside an area of the metal encapsulating sheet across from the substrate on which the display unit is formed.

The light-emitting region may include the display unit and a sealing layer surrounding the display unit.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
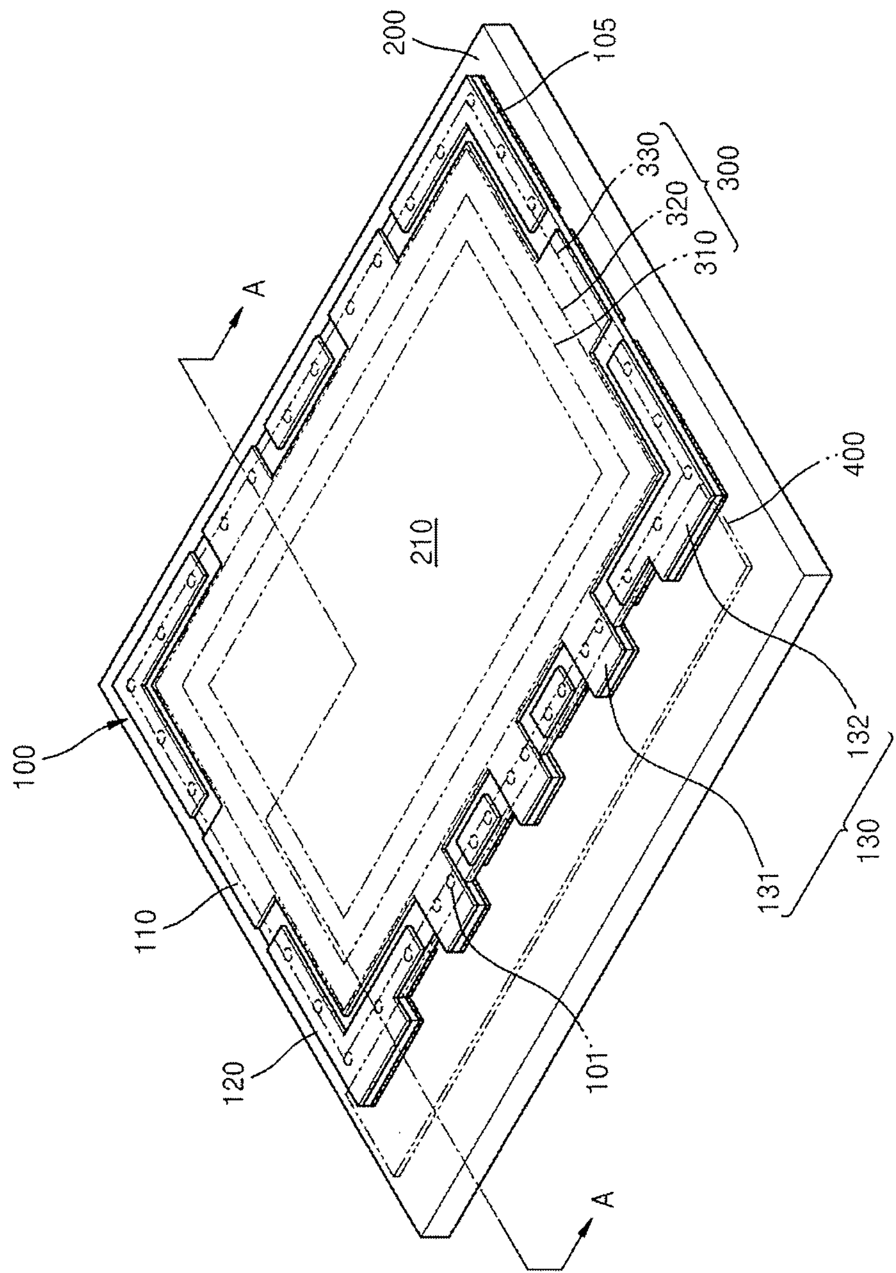
FIG. 1 is a perspective view of an organic light-emitting display apparatus including a metal encapsulating sheet according to an embodiment of the present invention.

Embodiments of the present invention will now be described more fully with reference to the accompanying drawings, in which exemplary embodiments of the present invention are shown.

The present invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions may be exaggerated for clarity.

It will also be understood that when a layer is referred to as being "on" another layer or substrate, it can be directly on the other layer or substrate, or intervening layers may also be present. Furthermore, when a component is referred to as being "coupled to" or "connected to" another component, it can be "directly connected to" the other component, or can be "electrically connected to" the other component via one or more other components therebetween.

Figure 2:
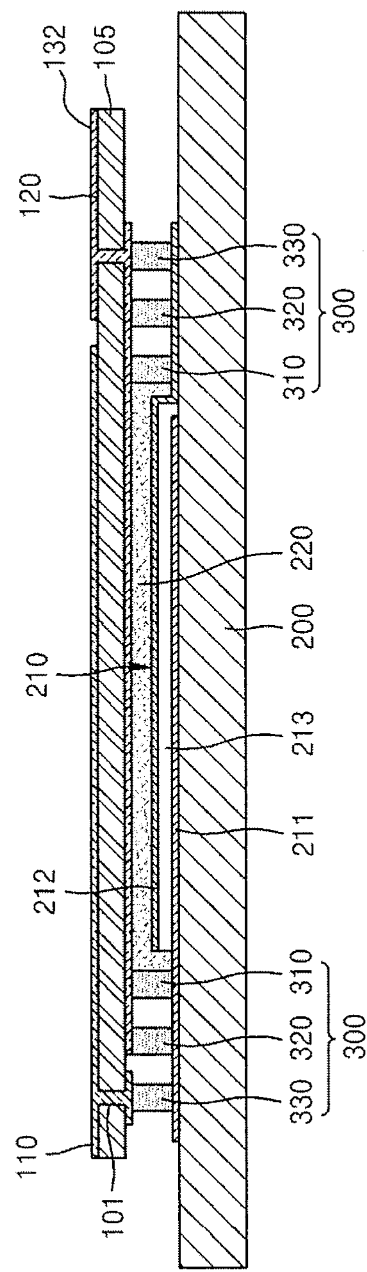
FIG. 2 is a cross-sectional view taken along the line A-A of FIG. 1.

FIG. 1 is a perspective view of an organic light-emitting display apparatus including a metal encapsulating sheet 100, according to an embodiment of the present invention, and FIG. 2 is a cross-sectional view taken along the line A-A of FIG. 1.

As shown in FIGS. 1 and 2, the organic light-emitting display apparatus according to the present embodiment includes a substrate 200, on which a display unit 210 is installed, and the metal encapsulating sheet 100 as an encapsulating member for covering and protecting the display unit 210.

The substrate 200 may be, for example, a glass substrate or a transparent polymer substrate. Light emitted by the display unit 210 is transmitted through the substrate 200 and is emitted to the outside.

The display unit 210 includes a light-emitting layer 213, a first electrode 211, and a second electrode 212, wherein the first electrode 211 and the second electrode 212 are arranged to face each other across the light-emitting layer 213. When voltages are applied to the first electrode 211 and the second electrode 212, and a suitable voltage condition is formed between the first and second electrodes 211 and 212, the light-emitting layer 213 emits light.

Here, although the first and second electrodes 211 and 212 are shown in a simple form for convenience of explanation, according to embodiments of the present invention, the first electrode 211 includes a pixel electrode (not shown) arranged below the light-emitting layer 213 and a current line (not shown) coupled to the pixel electrode via source/drain electrodes (not shown), and the second electrode 212 includes a counter electrode (not shown) arranged above the light-emitting layer 213 and a current line (not shown) coupled to the counter electrode. In other words, the first electrode 211 may be considered as an electrode unit for supplying an anode voltage to a side of the light-emitting layer 213 on the substrate 200, whereas the second electrode 212 may be considered as an electrode unit for supplying a cathode voltage to the other side of the light-emitting layer 213.

Furthermore, the display unit 210 of the present embodiment includes a gate wiring (not shown) for transmitting a scan signal to each of the pixels, and a data wiring (not shown) for transmitting a data signal to each of the pixels.

However, a first wiring 110, which is for transmitting an anode voltage (referred to hereinafter as a 'Vdd voltage') applied from outside to the first electrode 211, and a second wiring 120, which is for transmitting a cathode voltage (referred to hereinafter as a 'Vss voltage') applied from outside to the second electrode 212, are arranged on the metal encapsulating sheet 100, which is an encapsulating member, instead of on the substrate 200. In this case, the first and second wirings 110 and 120, the gate wiring, and the data wiring are arranged on different substrates, namely, the metal encapsulating sheet 100 and the second substrate 200, which are several millimeters apart from each other by interposing the display unit 210 therebetween. Therefore, a problem of capacitance load due to a large number of electric wirings densely arranged in the single substrate 200 and closely overlapping each other may be reduced. The structure of the metal encapsulating sheet 100 of the present embodiment will be described below.

The display unit 210 is surrounded by a sealing layer 300, which includes a getter layer 310, an adhesive layer 320, and a conductive adhesive layer 330 on the substrate 200. An inner region up to and including the sealing layer 300 is referred to as a light-emitting region of the display unit 210.

Hereinafter, referring to FIGS. 3A and 3B, structures of the substrate 200 and the sealing layer 300 of the present embodiment will be described.

Figure 3A:
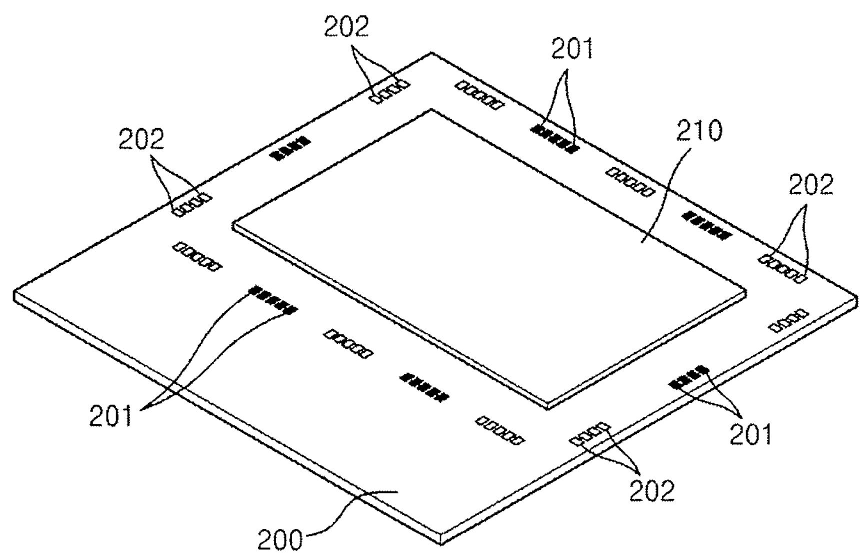
FIGS. 3A and 3B are perspective views of a substrate of the organic light-emitting display apparatus of the embodiment shown in FIG. 1.

First, as shown in FIG. 3A, a first pad unit 201 and a second pad unit 202 are formed around the display unit 210 on the substrate 200. The first pad unit 201 is coupled to the first electrode 211 of the display unit 210, whereas the second pad unit 202 is coupled to the second electrode 212 of the display unit 210. The locations and number of first pad units 201 and second pad units 202 are not limited to the present embodiment.

Figure 3B:
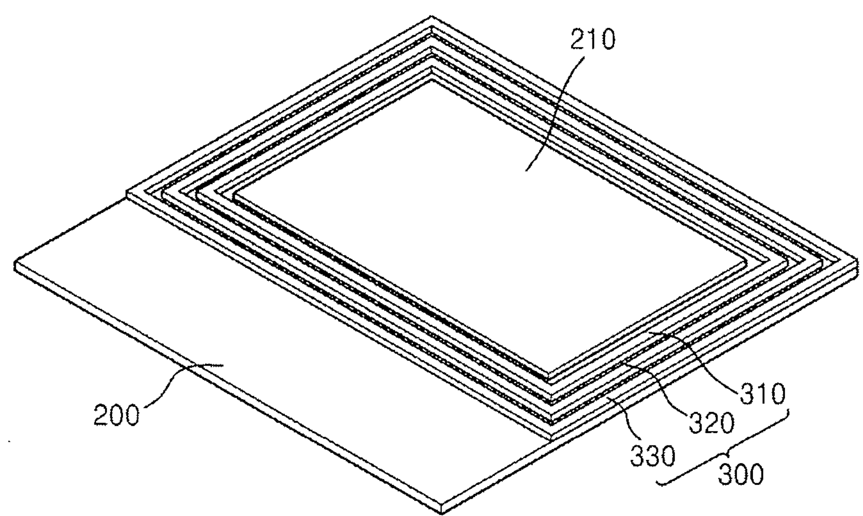

Referring to FIG. 3B, the getter layer 310, the adhesive layer 320, and the conductive adhesive layer 330 are formed around the display unit 210 as a sealing layer 300 for surrounding the display unit 210. The getter layer 310, the adhesive layer 320, and the conductive adhesive layer 330 may be formed by applying a liquid or paste material onto the substrate 200 by using, for example, a dispenser or a screen printer, and by drying the liquid or paste material.

The getter layer 310 contains a getter material which absorbs moisture and oxygen. Examples of getter materials include, for example, barium oxide, calcium oxide, magnesium oxide, lithium oxide, sodium oxide, potassium oxide, lithium sulfide, sodium sulfide, calcium sulfide, magnesium sulfide, potassium sulfide, potassium chloride, magnesium chloride, calcium bromide, cesium bromide, vanadium bromide, calcium nitride, etc. The getter layer 310 is located closest to the display unit 210, so that the getter layer 310 reduces permeation of moisture and oxygen into the display unit 210.

The adhesive layer 320 is located outside of the getter layer 310 (e.g., the getter layer 310 may be between the adhesive layer 320 and the display unit 210), and the conductive adhesive layer 330 is located outside of the adhesive layer 320 (e.g., the adhesive layer 320 may be between the conductive adhesive layer 330 and the display unit 210). The adhesive layer 320 and the conductive adhesive layer 330 according to the present embodiment include an ultraviolet ray hardening resin or a thermal hardening resin (e.g., epoxy resin).

The conductive adhesive layer 330 is formed on, and contacts, the first pad unit 201 and the second pad unit 202. In the present embodiment, the conductive adhesive layer 330 exhibits electrical conductivity in a thickness-wise direction of the substrate 200 (e.g., in a direction of the thickness of the substrate, such as in a vertical direction in FIG. 2) and exhibits electrically insulative properties in other directions. Such a conductive adhesive layer (e.g., a conductive adhesive layer exhibiting anisotropic characteristics) is known to those skilled in the art, and will not be discussed in detail herein. Therefore, even if the single conductive adhesive layer 330 contacts both the first pad unit 201 and the second pad unit 202, a short circuit does not occur between the first pad unit 201 and the second pad unit 202.

As described above, the sealing layer 300 protects the display unit 210 by surrounding the display unit 210 with three layers, wherein the getter layer 310 also removes moisture and oxygen, the adhesive layer 320 tightly adheres the substrate 200 and the metal encapsulating sheet 100, and the conductive adhesive layer 330 also tightly adheres the substrate 200 and the metal encapsulating sheet 100 and further electrically couples the first and second wirings 110 and 120 of the metal encapsulating sheet 100 described below to the first and second electrodes 211 and 212 of the substrate 200, respectively.

Next, the structure of the metal encapsulating sheet 100 of the present embodiment will be described.

Referring to FIGS. 1 and 2, the metal encapsulating sheet 100 of the present embodiment includes an insulating base film 105, and metal wirings 110 and 120, which are each formed on both surfaces of the base film 105 and form current paths.

The base film 105 may be formed of a polymer material with low moisture and oxygen permeability, e.g., polyethylene terephthalate, polyethylene naphthalate, polyimide, polycarbonate, or the like, and may have a thickness from about 1 μm to about 300 μm, for example.

The metal wirings 110 and 120 are inorganic layers, which do not transmit moisture and oxygen, and which seal the display unit 210 together with the adhesive layer 320. Furthermore, the metal wirings 110 and 120 also function to transmit electric signals to the first and second electrodes 211 and 212 of the display unit 210.

The metal wirings 110 and 120 include the first wiring 110 coupled to the first electrode 211 of the display unit 210, and the second wiring 120 coupled to the second electrode 212. Both of the first and second wirings 110 and 120 are formed to extend on both surfaces of the base film 105 via a penetration hole 101. In other words, the two wirings, namely, the first and second wirings 110 and 120, are each configured to extend from a surface of the base film 105 to the other surface of the base film 105 via the penetration hole 101. However, the first wiring 110 and the second wiring 120 are electrically separated from each other using the insulating base film 105.

Therefore, an electric signal via the first wiring 110 (e.g., corresponding to the Vdd voltage) is transmitted to the first electrode 211 of the display unit 210 via the conductive adhesive layer 330 and the first pad unit 201, whereas an electric signal via the second wiring 120 (e.g., corresponding to the Vss voltage) is transmitted to the second electrode 212 of the display unit 210 via the conductive adhesive layer 330 and the second pad unit 202. The first and second wirings 110 and 120 may be formed of, for example, aluminum (Al) or copper (Cu).

Connecting unit 130 respectively couples the first and second wirings 110 and 120 to a circuit board 400 for power supply. In other words, a first connecting unit 131 extending from the first wiring 110, and a second connecting unit 132 extending from the second wiring 120, are formed to protrude toward outside of the light-emitting region, and the circuit board 400 is coupled (e.g., directly connected) to the protruding connecting unit 130 via soldering. Therefore, when electric signals (e.g., the Vdd voltage and the Vss voltage) are applied from a power supply (not shown) via the circuit board 400, the electric signals are transmitted to the first and second wirings 110 and 120 respectively via the first and second connecting units 131 and 132 coupled to the circuit board 400, and are then respectively transmitted to the first and second electrodes 211 and 212 of the display unit 210 via the conductive adhesive layer 330 and the first and second pad units 201 and 202, as described above.

Here, the formation of the connecting unit 130 to protrude toward outside of the light-emitting region as described above is very important for safely protecting the display unit 210. In other words, the light-emitting region refers to a region inside the sealing layer 300 surrounding the display unit 210 as described above. Here, if the connecting unit 130 is located in the light-emitting region, it is very likely that heat generated while the circuit board 400 is fixed by soldering will affect the display unit 210. Therefore, the possibility that heat generated while the circuit board 400 is soldered might damage or deteriorate the display unit 210 is reduced or eliminated by forming the connecting unit 130 to protrude out of the light-emitting region. Furthermore, as shown in FIG. 1, if the first and second connecting units 131 and 132 are formed on a same side of a same surface of the base film 105, it is very convenient to attach the circuit board 400 thereto.

Therefore, according to the structure described above, since the first and second wirings 110 and 120 for applying the Vdd voltage and the Vss voltage are distributed on the metal encapsulating sheet 100, which is an encapsulating member, instead of arranging all electric wirings on the substrate 200, capacitance load may be suppressed. Furthermore, the connecting unit 130 is formed to protrude out of the light-emitting region, such that the display unit 210 is not deteriorated when the circuit board 400 is connected. Therefore, stable and consistent quality of an organic light-emitting display apparatus may be achieved. The reference numeral 220 denotes a moisture absorbent.

Various modifications may be made in the metal encapsulating sheet 100 of the present embodiment. FIGS. 4 through 7 show examples of such modifications corresponding to alternative embodiments of the present invention.

Figure 4:
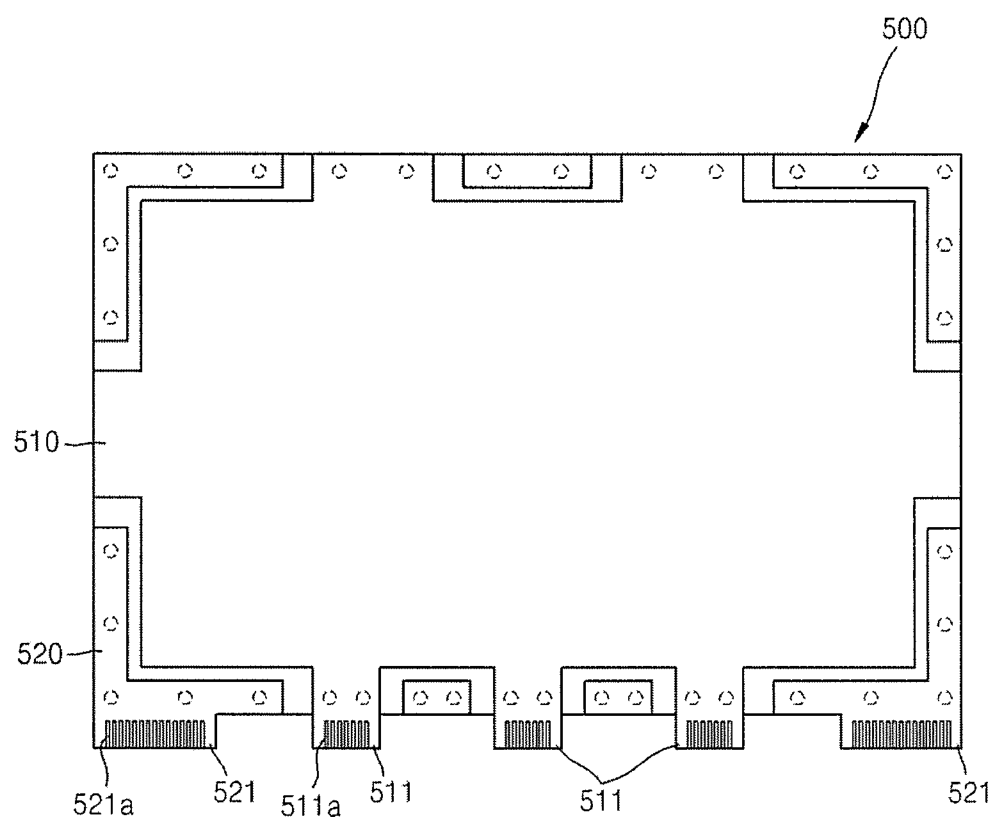
FIGS. 4 through 7 are diagrams showing modified examples of the metal encapsulating sheet of the embodiment shown in FIG. 1.
Figure 5:
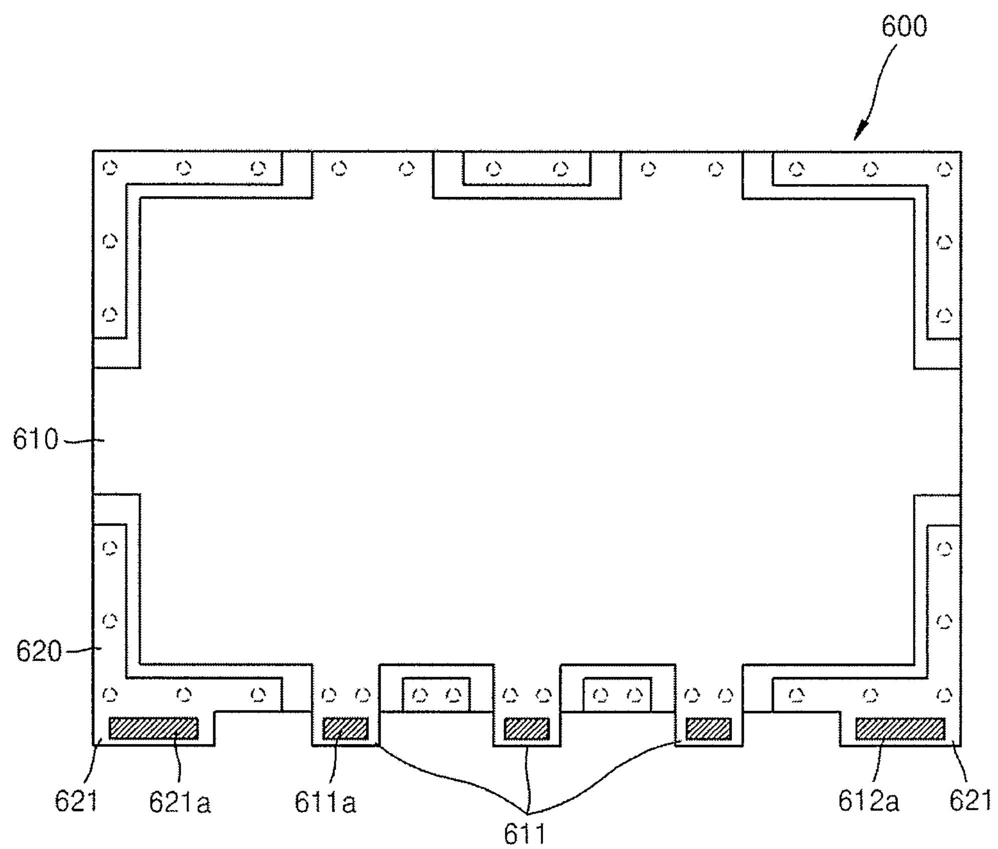

First, as in the previous embodiment, a metal encapsulating sheet 500 of the embodiment shown in FIG. 4 includes a first wiring 510 for transmitting the Vdd voltage, a second wiring 520 for transmitting the Vss voltage, and first and second connecting units 511 and 521, which extend from the first and second wirings 510 and 520 and protrude out of the light-emitting region for coupling the circuit board (e.g., circuit board 400 of the embodiment shown in FIG. 1) to outside of the light-emitting region.

Furthermore, in the present embodiment, stripe-shaped terminal patterns 511*a* and 521*a* are further formed on the first and second connecting units 511 and 521, respectively. By forming the terminal patterns 511*a* and 521*a*, solder attachment of the circuit board 400 may be strengthened.

Figure 6:
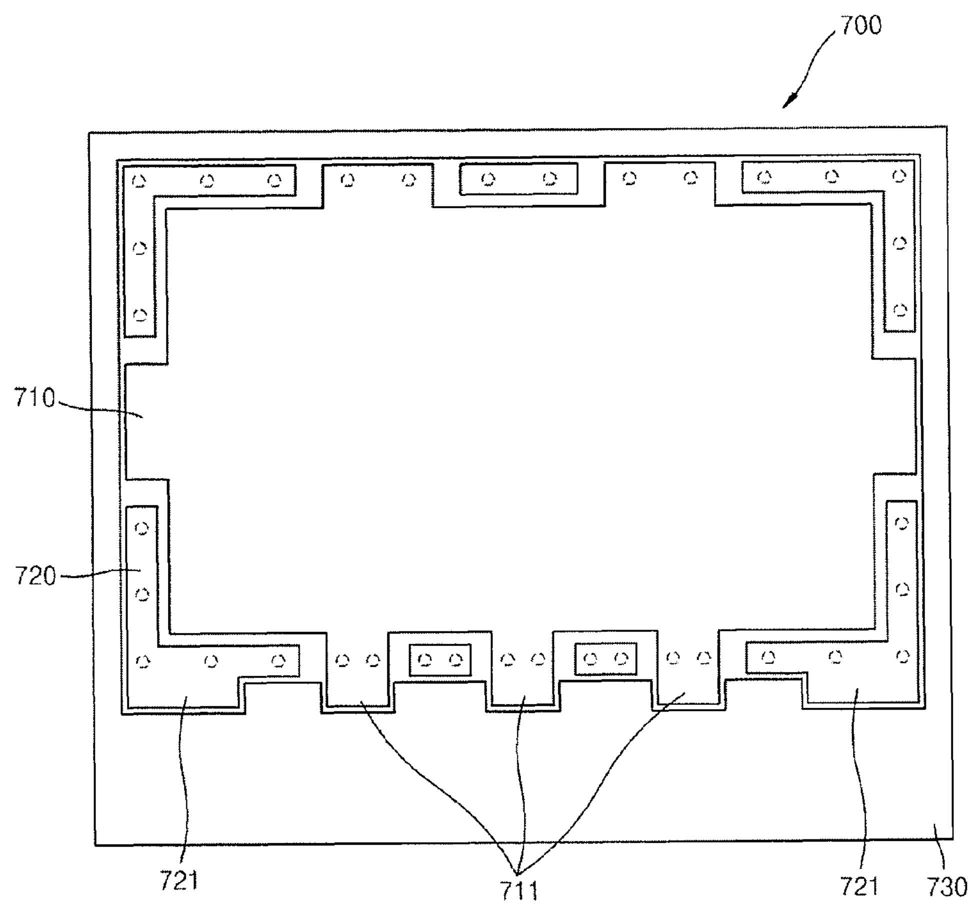

A metal encapsulating sheet 600 of the embodiment shown in FIG. 6 also includes a first wiring 610 for transmitting the Vdd voltage, a second wiring 620 for transmitting the Vss voltage, and first and second connecting units 611 and 621, which respectively extend from the first and second wirings 610 and 620 and protrude out of the light-emitting region for coupling the circuit board (e.g., circuit board 400 shown in FIG. 1) to outside of the light-emitting region.

Furthermore, in the present embodiment, auxiliary metal films 611*a* and 621*a*, which may be formed of tin or zinc, are further formed on the first and second connecting units 611 and 621. By forming the auxiliary metal films 611*a* and 621*a*, solder attachment of the circuit board 400 may be strengthened.

Next, a metal encapsulating sheet 700 shown in FIG. 6 also includes a first wiring 710 for transmitting the Vdd voltage, a second wiring 720 for transmitting the Vss voltage, and first and second connecting units 711 and 721, which respectively extend from the first and second wirings 710 and 720 and protrude out of the light-emitting region for coupling the circuit board (e.g., circuit board 400 of the embodiment shown in FIG. 1) to outside of the light-emitting region.

In the present embodiment, a dummy unit 730 is further formed for making the size of the metal encapsulating sheet 700 identical to the size of the substrate (e.g., substrate 200; refer to FIG. 1). By forming the dummy unit 730, the deterioration of durability due to the formation of a step between the metal encapsulating sheet 700 and the substrate 200 may be reduced or prevented.

Figure 7:
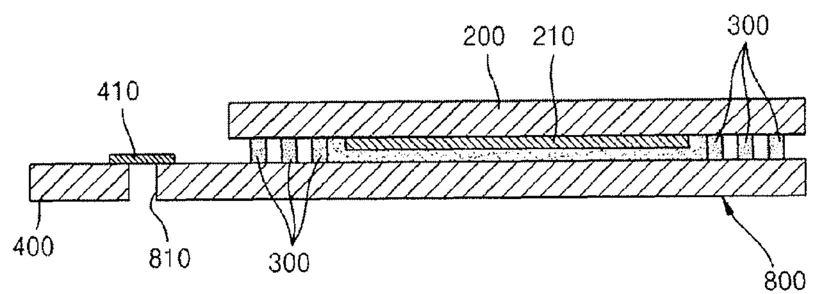

A metal encapsulating sheet 800 of the embodiment shown in FIG. 7 is larger than the substrate 200. A connecting unit 810 to which the circuit board 400 is coupled is located outside of the sealing layer 300, and more particularly, outside of the substrate 200. The present embodiment shows that the metal encapsulating sheet 800 may be formed to be larger than the substrate 200. The reference numeral 410 denotes a flexible circuit board.

As described above, in an organic light-emitting display apparatus according to embodiments of the present invention, capacitance load(s) may be suppressed by distributing electric wirings to a substrate and a metal encapsulating sheet. Furthermore, the deterioration of a display unit may be reduced or prevented by forming a connecting unit to protrude out of a light-emitting region, and thus, stable quality of an organic light-emitting display apparatus may be secured.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A metal encapsulating sheet configured to cover a display unit on a substrate, the metal encapsulating sheet comprising:

an insulating base film; and a first metal wiring and a second metal wiring on the base film for forming a current path between the display unit and a power supply;

a first connecting unit extending from the first metal wiring; and a second connecting unit extending from the second metal wiring, wherein the first and second connecting units of the first and second metal wirings coupled to the power supply are outside a light-emitting region corresponding to the display unit.

2. The metal encapsulating sheet of claim 1, wherein the first wiring is coupled to a first electrode of the display unit, and wherein the second wiring is coupled to a second electrode of the display unit and is electrically separated from the first wiring by the insulating base film.

3. The metal encapsulating sheet of claim 1, wherein the connecting units protrude out of the light-emitting region.

4. The metal encapsulating sheet of claim 3, wherein a circuit board is directly coupled to the connecting units for coupling the connecting units and the power supply.

5. The metal encapsulating sheet of claim 4, wherein one or more of the connecting units comprise terminal patterns.

6. The metal encapsulating sheet of claim 4, wherein one or more of the connecting units comprise auxiliary metal films for strengthening solder attachment.

7. The metal encapsulating sheet of claim 3, further comprising a dummy unit outside an area corresponding to the connecting units for increasing the size of the metal encapsulating sheet.

8. The metal encapsulating sheet of claim 1, wherein the connecting units are outside an area of the metal encapsulating sheet across from the substrate on which the display unit is formed.

9. The metal encapsulating sheet of claim 1, wherein the light-emitting region comprises the display unit and a sealing layer surrounding the display unit.

10. A metal encapsulating sheet configured to cover a display unit on a substrate, the metal encapsulating sheet comprising:

an insulating base film; and metal wirings on the base film for forming a current path between the display unit and a power supply, the metal wirings comprising:

a first wiring coupled to a first electrode of the display unit; and a second wiring coupled to a second electrode of the display unit and electrically separated from the first wiring by the insulating base film, wherein connecting units of the metal wirings coupled to the power supply are outside a light-emitting region corresponding to the display unit, and wherein a first connecting unit of the connecting units corresponding to the first wiring and a second connecting unit of the connecting units corresponding to the second wiring are at a same side of a same surface of the base film.

11. An organic light-emitting display apparatus comprising:

a substrate;

a display unit on the substrate; and an encapsulating member covering the display unit and comprising:

an insulating base film; and first and second metal wirings on the base film for forming a current path between the display unit and a power supply; and first and second connecting units respectively extending from the first and second metal wirings coupled to the power supply and located outside a light-emitting region corresponding to the display unit.

12. The organic light-emitting display apparatus of claim 11, wherein the first wiring is coupled to a first electrode of the display unit, and wherein the second wiring is coupled to a second electrode of the display unit and electrically separated from the first wiring by the insulating base film.

13. The organic light-emitting display apparatus of claim 11, wherein the connecting units protrude out of the light-emitting region.

14. The organic light-emitting display apparatus of claim 13, wherein a circuit board is directly coupled to the connecting units for coupling the connecting units and the power supply.

15. The organic light-emitting display apparatus of claim 14, wherein the connecting units comprise terminal patterns.

16. The organic light-emitting display apparatus of claim 14, wherein the connecting units comprise auxiliary metal films for strengthening solder attachment.

17. The organic light-emitting display apparatus of claim 13, further comprising a dummy unit outside an area corresponding to the connecting units for increasing the size of the metal encapsulating sheet.

18. The organic light-emitting display apparatus of claim 11, wherein the connecting units are outside an area of the metal encapsulating sheet across from the substrate on which the display unit is formed.

19. The organic light-emitting display apparatus of claim 11, wherein the light-emitting region comprises the display unit and a sealing layer surrounding the display unit.

20. An organic light-emitting display apparatus comprising:

a substrate;

a display unit on the substrate; and an encapsulating member covering the display unit and comprising:

an insulating base film; and metal wirings on the base film for forming a current path between the display unit and a power supply, the metal wirings comprising:

a first wiring coupled to a first electrode of the display unit; and a second wiring coupled to a second electrode of the display unit and electrically separated from the first wiring by the insulating base film; and connecting units coupled to the power supply and located outside a light-emitting region corresponding to the display unit, wherein a first connecting unit of the connecting units corresponding to the first wiring and a second connecting unit of the connecting units corresponding to the second wiring are at a same side of a same surface of the base film.

* * * * *